US008903556B2

(12) United States Patent
Archer et al.

(10) Patent No.: US 8,903,556 B2
(45) Date of Patent: Dec. 2, 2014

(54) MANAGING WASTE WATER DISCHARGE OF A COMPUTING SYSTEM

(75) Inventors: David W. Archer, Sammamish, WA (US); James J. Bozek, Bothell, WA (US); Nils P. Hansson, Monroe, WA (US); James L. Wooldridge, Fall City, WA (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 13/310,898

(22) Filed: Dec. 5, 2011

(65) Prior Publication Data

US 2013/0144434 A1 Jun. 6, 2013

(51) Int. Cl.
*G05D 9/00* (2006.01)
*G05D 7/00* (2006.01)

(52) U.S. Cl.
USPC .......................................... 700/281; 700/282

(58) Field of Classification Search
CPC . H05K 7/20827; H05K 7/20836; H05K 1/02; F28F 27/00; G06F 1/206; G06F 2200/201
USPC ................. 700/276–278, 281–282, 299–300; 62/166–167, 259.2; 165/58, 104.33, 165/287; 361/679.46, 688
See application file for complete search history.

(56) References Cited

U.S. PATENT DOCUMENTS 8,151,578 B1* 4/2012 Morales et al. .................... 62/91
8,189,334 B2* 5/2012 Campbell et al. ............. 361/691
8,209,993 B2* 7/2012 Carlson et al. ............... 62/259.2
8,223,495 B1* 7/2012 Carlson et al. ................ 361/701
8,553,416 B1* 10/2013 Carlson et al. ................ 361/701
8,578,726 B2* 11/2013 Hay ................................ 62/175
8,584,477 B2* 11/2013 Hay ................................ 62/171
8,590,333 B2* 11/2013 Carlson et al. ............... 62/259.2
2007/0170270 A1 7/2007 Jelinek et al.
2010/0089456 A1 4/2010 Lowery
2010/0154448 A1 6/2010 Hay
2011/0009047 A1 1/2011 Noteboom et al.
2011/0100045 A1* 5/2011 Carlson ........................ 62/259.2

(Continued)

FOREIGN PATENT DOCUMENTS

KR 20070098164 A 10/2007
WO WO 2011062580 A1 5/2011

OTHER PUBLICATIONS

EcoCooling Limited, "Energy Efficient Server Room and Data Centre Cooling Computer", http://mvdirona.com/jrh/talksAndPapers/CREC%20manual.pdf, 2010, pp. 1-8, EcoCooling Limited, United Kingdom.

*Primary Examiner* — Ramesh Patel
(74) *Attorney, Agent, or Firm* — Edward J. Lenart; Katherine S. Brown; Biggers Kennedy Lenart Spraggins LLP

(57) ABSTRACT

Managing waste water discharge of a computing system, the computing system including one or more evaporative coolers, including: determining, by a waste water management module, a waste water discharge limit, wherein the waste water discharge limit specifies the amount of waste water that can be discharged within a period of time; determining, by the waste water management module, the amount of waste water that has been discharged during a current measurement period; and updating, by the waste water management module, operating parameters for the computing system in dependence upon the amount of waste water that has been discharged during the current measurement period and the waste water discharge limit.

13 Claims, 4 Drawing Sheets

(56) References Cited

U.S. PATENT DOCUMENTS

| | | |
|---|---|---|
| 2011/0113360 A1* | 5/2011 | Johnson et al. ............... 715/771 |
| 2011/0189936 A1 | 8/2011 | Haspers et al. |
| 2011/0195652 A1 | 8/2011 | Smith |
| 2012/0072195 A1* | 3/2012 | Archibald et al. ................ 703/9 |
| 2012/0278810 A1* | 11/2012 | Dawson et al. ............... 718/102 |
| 2013/0036410 A1* | 2/2013 | Bates et al. .................... 717/148 |
| 2013/0124003 A1* | 5/2013 | Lehman ........................ 700/300 |
| 2013/0233532 A1* | 9/2013 | Imwalle et al. ............... 165/287 |
| 2014/0055949 A1* | 2/2014 | Campbell et al. ............. 361/691 |
| 2014/0063730 A1* | 3/2014 | Hay ......................... 361/679.46 |

\* cited by examiner

MANAGING WASTE WATER DISCHARGE OF A COMPUTING SYSTEM

BACKGROUND OF THE INVENTION

1. Field of the Invention

The field of the invention is data processing, or, more specifically, methods, apparatus, and products for managing waste water discharge of a computing system.

2. Description of Related Art

Increasingly, new high density data centers are cooled by evaporative coolers (ECs) due to the reduced cost of cooling inherent to ECs. A known waste product from the EC datacenters is waste water. While EC waste water can be used for irrigation purposes, many data centers using ECs are in deserts areas, where the water has high concentration of salts. Consequently, municipal governance is placed on EC cooled data centers to regulate and control the volume of discharged waste water.

SUMMARY OF THE INVENTION

Methods, apparatus, and products for managing waste water discharge of a computing system, the computing system including one or more evaporative coolers, including: determining, by a waste water management module, a waste water discharge limit, wherein the waste water discharge limit specifies the amount of waste water that can be discharged within a period of time; determining, by the waste water management module, the amount of waste water that has been discharged during a current measurement period; and updating, by the waste water management module, operating parameters for the computing system in dependence upon the amount of waste water that has been discharged during the current measurement period and the waste water discharge limit.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
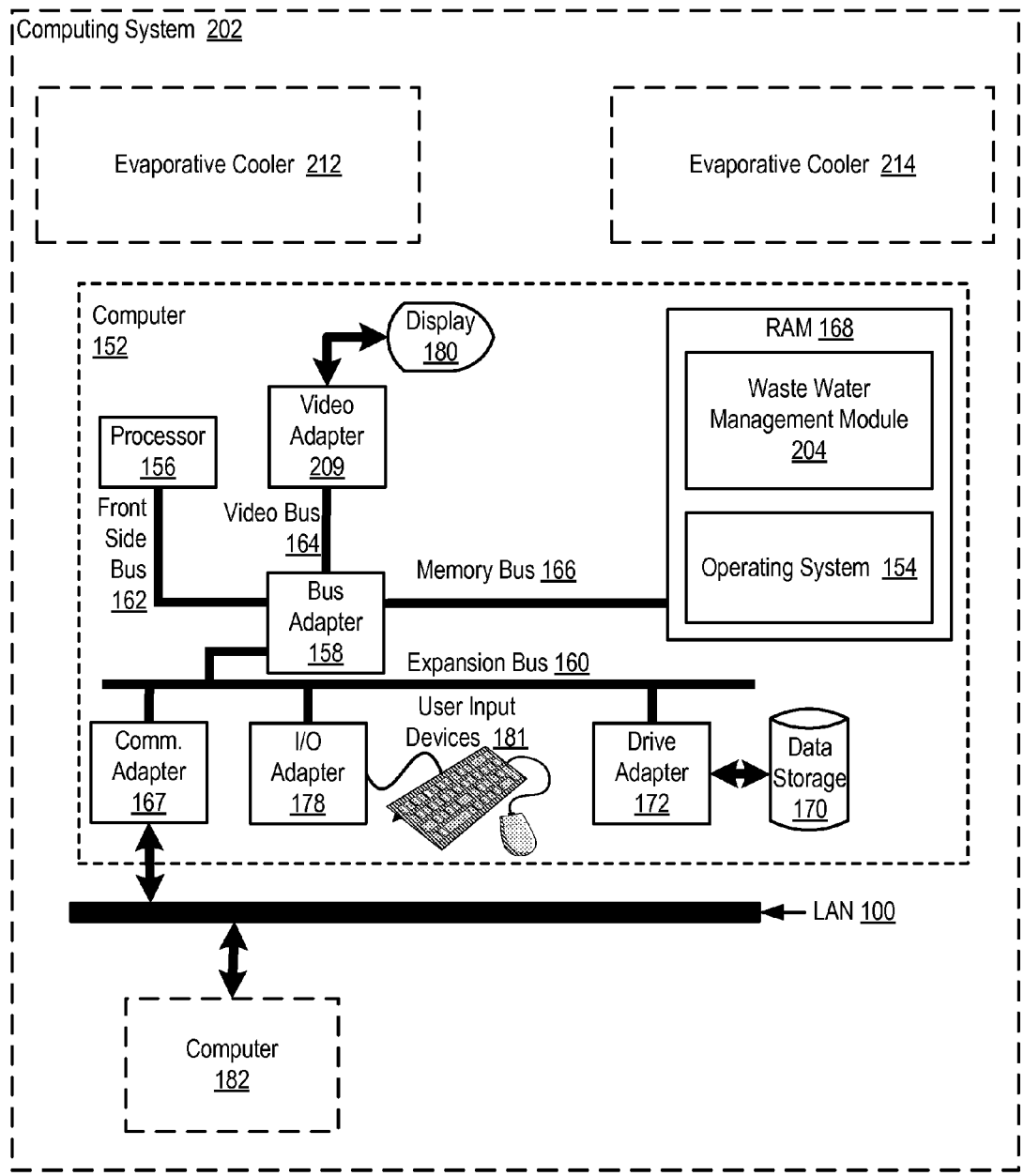
FIG. 1 sets forth a block diagram of automated computing machinery comprising an example computer useful in managing waste water discharge of a computing system according to embodiments of the present invention.

Example methods, apparatus, and products for managing waste water discharge of a computing system in accordance with the present invention are described with reference to the accompanying drawings, beginning with FIG. 1. FIG. 1 sets forth a block diagram of automated computing machinery comprising an example computer (152) useful in managing waste water discharge of a computing system according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a waste water management module (204), a module of computer program instructions for managing waste water discharge of a computing system (202) according to embodiments of the present invention. The computing system (202) of FIG. 1 includes one or more evaporative coolers (212, 214). In the example of FIG. 1, an evaporative cooler (212, 214) is a device that cools air through the evaporation of water. Unlike refrigeration cooling devices, evaporative coolers (212, 214) require a water source and must continually consume and discharge water to operate. Water can be discharged from an evaporative cooler (212, 214), for example, into a waste water system that is controlled by a municipality or other governmental entity. As such, the amount of water that may be discharged from an evaporative cooler (212, 214) may be subject to governmental ordinances.

The waste water management module (204) of FIG. 1 is configured to determine a waste water discharge limit. The waste water discharge limit specifies the amount of waste water that can be discharged from the evaporative cooler (212, 214) into a waste water system within a period of time. The waste water management module (204) can determine the waste water discharge limit, for example, by receiving the waste water discharge limit from a system administrator through the use of a graphical user interface ('GUI').

The waste water management module (204) of FIG. 1 is also configured to determine the amount of waste water that has been discharged during a current measurement period. Determining the amount of waste water that has been discharged during a current measurement period may be carried out, for example, through the use of a water meter that measures the amount of water that has been discharged from an evaporative cooler (212, 214). In such an example, information read by the water meter may be provided to the waste water management module (204) periodically so that the waste water management module (204) can sum up all readings that occurred during a current measurement period to determine the amount of waste water that has been discharged during a current measurement period.

The waste water management module (204) of FIG. 1 is also configured to update operating parameters for the computing system (202) in dependence upon the amount of waste water that has been discharged during the current measurement period and the waste water discharge limit. Operating parameters for the computing system (202) can include settings that affect the operation and performance of the computing system (202). Operating parameters may include, for example, a maximum CPU clock speed, the amount of power to be provided to a computing system (202), an identification of components within the computing system (202) that are to be powered down or placed in an idle state, and so on.

Also stored in RAM (168) is an operating system (154). Operating systems useful managing waste water discharge of a computing system according to embodiments of the present invention include UNIX™, Linux™, Microsoft XP™, AIX™, IBM's i5/OS™, and others as will occur to those of skill in the art. The operating system (154) and the waste water management module (204) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for managing waste water discharge of a computing system according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for managing waste water discharge of a computing system according to embodiments of the present invention include modems for wired dial-up communications, Ethernet (IEEE 802.3) adapters for wired data communications network communications, and 802.11 adapters for wireless data communications network communications.

Figure 2:
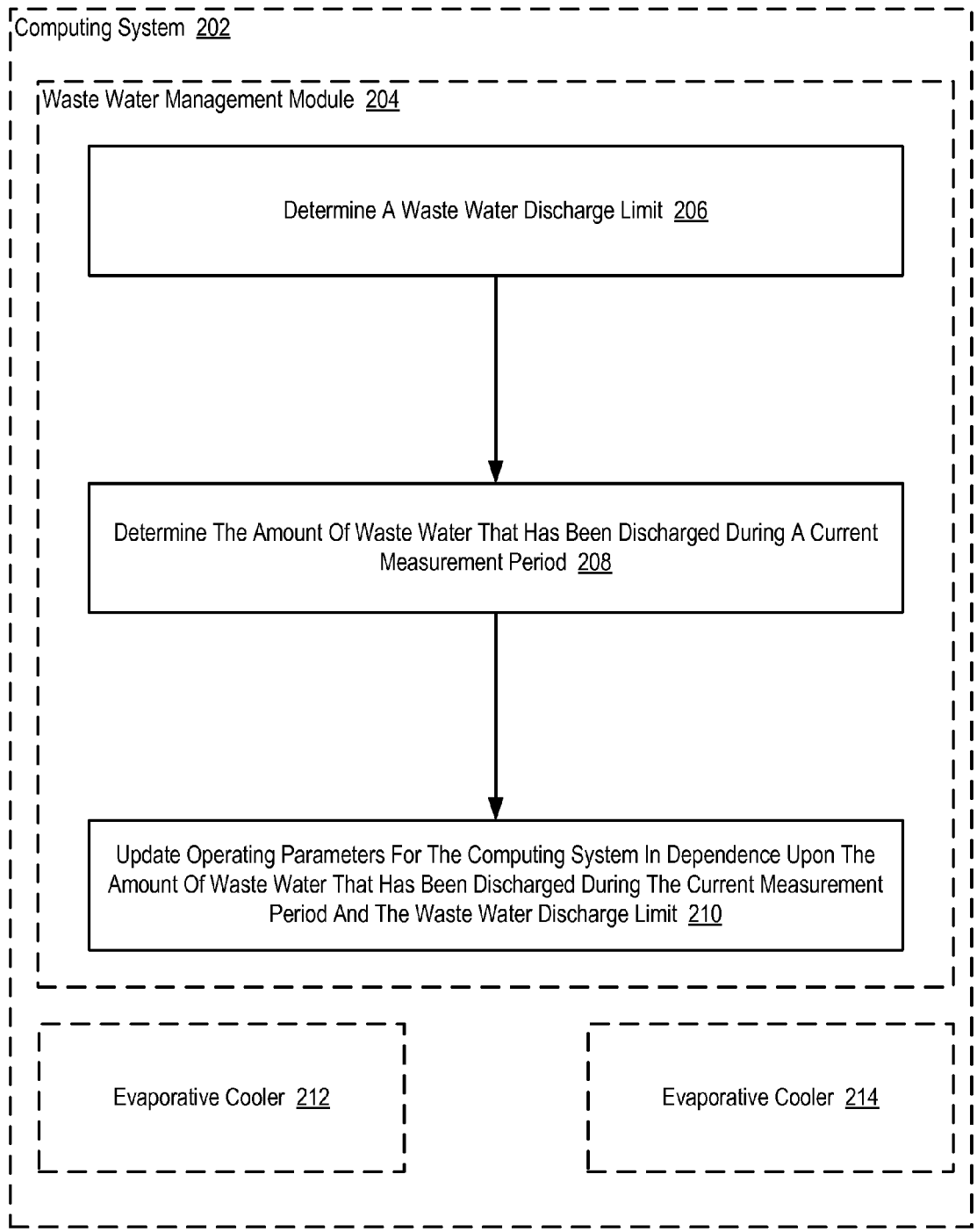
FIG. 2 sets forth a flow chart illustrating an example method for managing waste water discharge of a computing system according to embodiments of the present invention.

For further explanation, FIG. 2 sets forth a flow chart illustrating an example method for managing waste water discharge of a computing system (202) according to embodiments of the present invention. The computing system (202) of FIG. 2 includes one or more evaporative coolers (212, 214). In the example method of FIG. 2, an evaporative cooler (212, 214) is a device that cools air through the evaporation of water. Unlike refrigeration cooling devices, evaporative coolers (212, 214) require a water source and must continually consume and discharge water to operate. Water can be discharged from an evaporative cooler (212, 214), for example, into a waste water system that is controlled by a municipality or other governmental entity. As such, the amount of water that may be discharged from an evaporative cooler (212, 214) may be subject to governmental ordinances.

The example method of FIG. 2 includes determining (206), by a waste water management module (204), a waste water discharge limit. In the example method of FIG. 2, the waste water discharge limit specifies the amount of waste water that can be discharged within a period of time. The waste water discharge limit is determined (206) by a waste water management module (204) that may be embodied as a module of computer program instructions that, when executed, manages the discharging of waste water generated by an evaporative cooler (212, 214). Such a waste water management module (204) can determine (206) the waste water discharge limit, for example, by receiving the waste water discharge limit from a system administrator through the use of a GUI.

The example method of FIG. 2 also includes determining (208), by the waste water management module (204), the amount of waste water that has been discharged during a current measurement period. Determining (208) the amount of waste water that has been discharged during a current measurement period may be carried out, for example, through the use of a water meter that measures the amount of water that has been discharged from an evaporative cooler (212, 214). In such an example, information read by the water meter may be provided to the waste water management module (204) periodically so that the waste water management module (204) can sum up all readings that occurred during a current measurement period to determine (208) the amount of waste water that has been discharged during a current measurement period.

The example method of FIG. 2 also includes updating (210), by the waste water management module (204), operating parameters for the computing system (202) in dependence upon the amount of waste water that has been discharged during the current measurement period and the waste water discharge limit. In the example method of FIG. 2, operating parameters for the computing system (202) can include settings that affect the operation and performance of the computing system (202). Operating parameters may include, for example, a maximum CPU clock speed, the amount of power to be provided to a computing system (202), an identification of components within the computing system (202) that are to be powered down or placed in an idle state, and so on.

Consider an example in which a governmental ordinance specifies that an evaporative cooler (212, 214) within a data center is only allowed to generate 10 gallons of waste water per day without the owner of the data center incurring a fine. The waste water discharge limit is therefore set to 10 gallons per day. In such an example, assume that water discharge measurements are taken in 12 hour intervals so that operating parameters for the computing system (202) can be updated (210) in such a way so as to ensure that the waste water discharge limit is not exceeded. For example, assume that the computing system (202) was operated in such a way that, in order to sufficiently cool the computing system (202), each evaporative cooler (212, 214) had to operate at a level that resulted in each evaporative cooler (212, 214) discharging 7 gallons of waste water during a first 12 hour period. In such an example, continuing to operate the computing system (202) in the same way would cause each evaporative cooler (212, 214) to operate at a level that would result in each evaporative cooler (212, 214) discharging an additional 7 gallons of waste water during a second 12 hour period, thereby causing each evaporative cooler (212, 214) to discharge 14 gallons of waste water and to exceed the waste water discharge limit of 10 gallons per day. To avoid exceeding the waste water discharge limit, however, operating parameters for the computing system (202) can be updated (210) such that the computing system (202) generates less heat and requires less cooling from the evaporative coolers (212, 214). For example, particular machines within the data center may be powered down completely or placed in lower performance operating modes such that the less cooling is required from the evaporative coolers (212, 214) and less waste water is generated by the evaporative coolers (212, 214).

Figure 3:
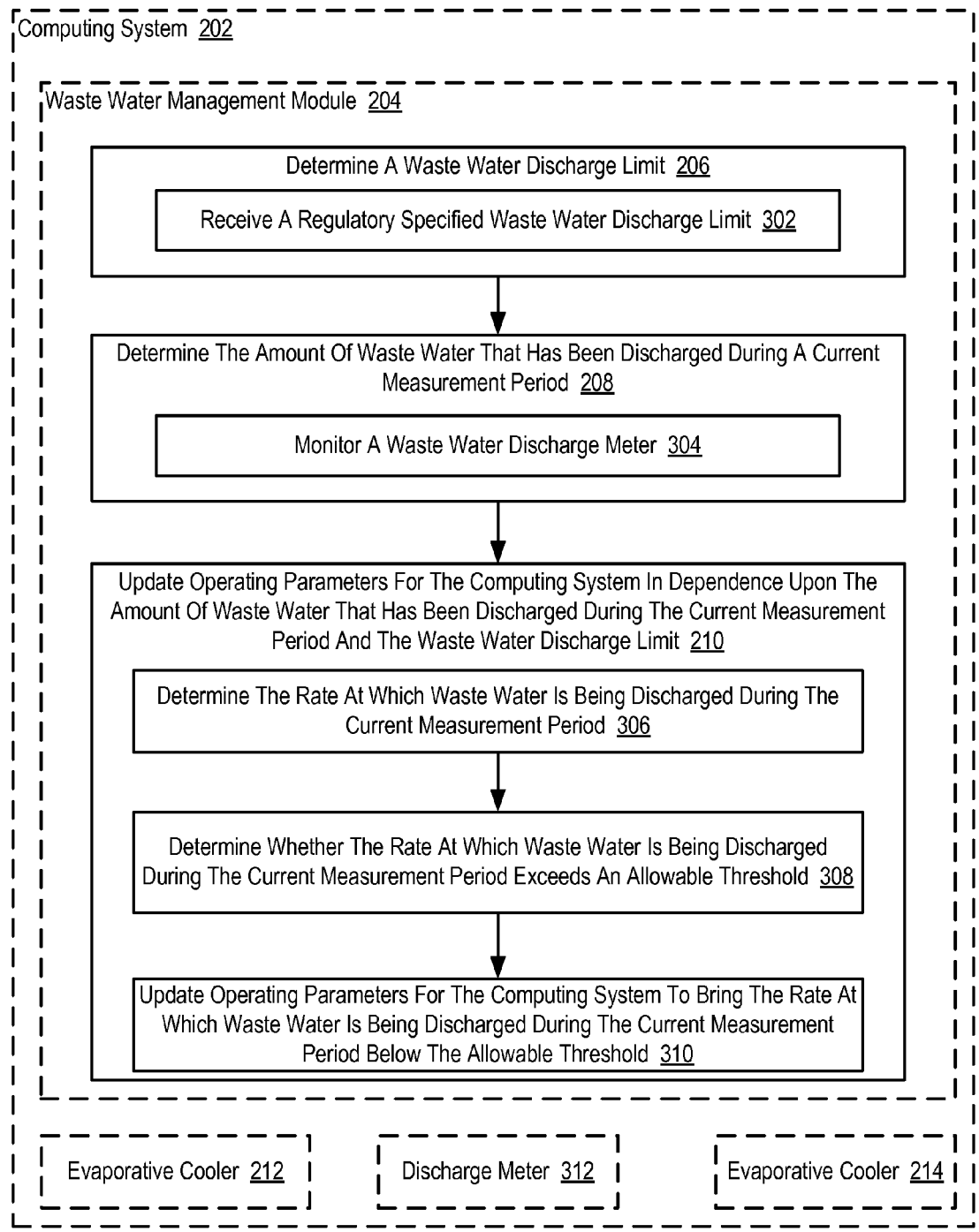
FIG. 3 sets forth a flow chart illustrating a further example method for managing waste water discharge of a computing system according to embodiments of the present invention.

For further explanation, FIG. 3 sets forth a further flow chart illustrating an example method for managing waste water discharge of a computing system (202) according to embodiments of the present invention. The example method of FIG. 3 is similar to the method of FIG. 2 as it also includes determining (206) a waste water discharge limit, determining (208) the amount of waste water that has been discharged during a current measurement period, and updating (210) operating parameters for the computing system (202) in dependence upon the amount of waste water that has been discharged during the current measurement period and the waste water discharge limit.

In the example method of FIG. 3, determining (206) a waste water discharge limit includes receiving (302) a regulatory specified waste water discharge limit. In the example method of FIG. 3, the regulatory specified waste water discharge limit represents the amount of waste water that may lawfully be discharged into a waste water system such as, for example, a sewer system. In the example method of FIG. 3, receiving (302) a regulatory specified waste water discharge limit may be carried out, for example, by receiving the regulatory specified waste water discharge limit from a system administrator, by setting a value accessible by the waste water management module (204), and so on.

In the example method of FIG. 3, determining (208) the amount of waste water that has been discharged during a current measurement period includes monitoring (304) a waste water discharge meter (312). In the example method of FIG. 3, the waste water discharge meter (312) is a device used to measure the volume of water that is discharged by the evaporative coolers (212, 214). The waste water discharge meter (312) of FIG. 3 may be coupled for data communications with the waste water management module (204), for example, via a wireless connection or a wired connection that makes use of data communications protocols such IP, TCP, UDP, and so on. The waste water discharge meter (312) of FIG. 3 may be monitored (304) according to a predetermined schedule, at predetermined intervals, upon the detection of water usage, and so on.

In the example method of FIG. 3, updating (210) operating parameters for the computing system (202) in dependence upon the amount of waste water that has been discharged during the current measurement period and the waste water discharge limit includes determining (306) the rate at which waste water is being discharged during the current measurement period. In the example method of FIG. 3, determining (306) the rate at which waste water is being discharged during the current measurement period may be carried out, for example, by determining the amount of waste water that has been discharged during the current measurement period and also determining the amount of time that has elapsed during the current measurement period. In such a way the rate at which waste water is being discharged during the current measurement period may be determined (306) by dividing the amount of waste water that has been discharged during the current measurement period by the amount of time that has elapsed during the current measurement period.

In the example method of FIG. 3, updating (210) operating parameters for the computing system (202) in dependence upon the amount of waste water that has been discharged during the current measurement period and the waste water discharge limit includes determining (308) whether the rate at which waste water is being discharged during the current measurement period exceeds an allowable threshold. In the example method of FIG. 3, the allowable threshold may be based, for example, on the waste water discharge limit. Consider an example in which the waste water discharge limit specifies that an evaporative cooler (212, 214) should not discharge more than 24 gallons of water per day. In such an example, if the measurement period is set to 15 minutes, the allowable threshold could be set to ¼ gallons of discharged waste water per 15 minutes. Alternatively, the allowable threshold may also be set at a level that, if exceeded, indicates a possible problem with the evaporative coolers (212, 214) or the computing system (202) as excessive amounts of waste water are being discharged.

In the example method of FIG. 3, updating (210) operating parameters for the computing system (202) in dependence upon the amount of waste water that has been discharged during the current measurement period and the waste water discharge limit includes responsive to determining that the rate at which waste water is being discharged during the current measurement period exceeds an allowable threshold, updating (310) operating parameters for the computing system (202) to bring the rate at which waste water is being discharged during the current measurement period below the allowable threshold. In the example method of FIG. 3, updating (310) operating parameters for the computing system (202) to bring the rate at which waste water is being discharged during the current measurement period below the allowable threshold may be carried out, for example, by powering down a predetermined set of resources that have been tested and are known to reduce waste water discharge by a predetermined amount. Alternatively, updating (310) operating parameters for the computing system (202) to bring the rate at which waste water is being discharged during the current measurement period below the allowable threshold may also be carried out by iteratively reducing power consumption of various computing devices and measuring the new rate at which waste water is being discharged and until the rate at which water is discharged falls below the allowable threshold.

Figure 4:
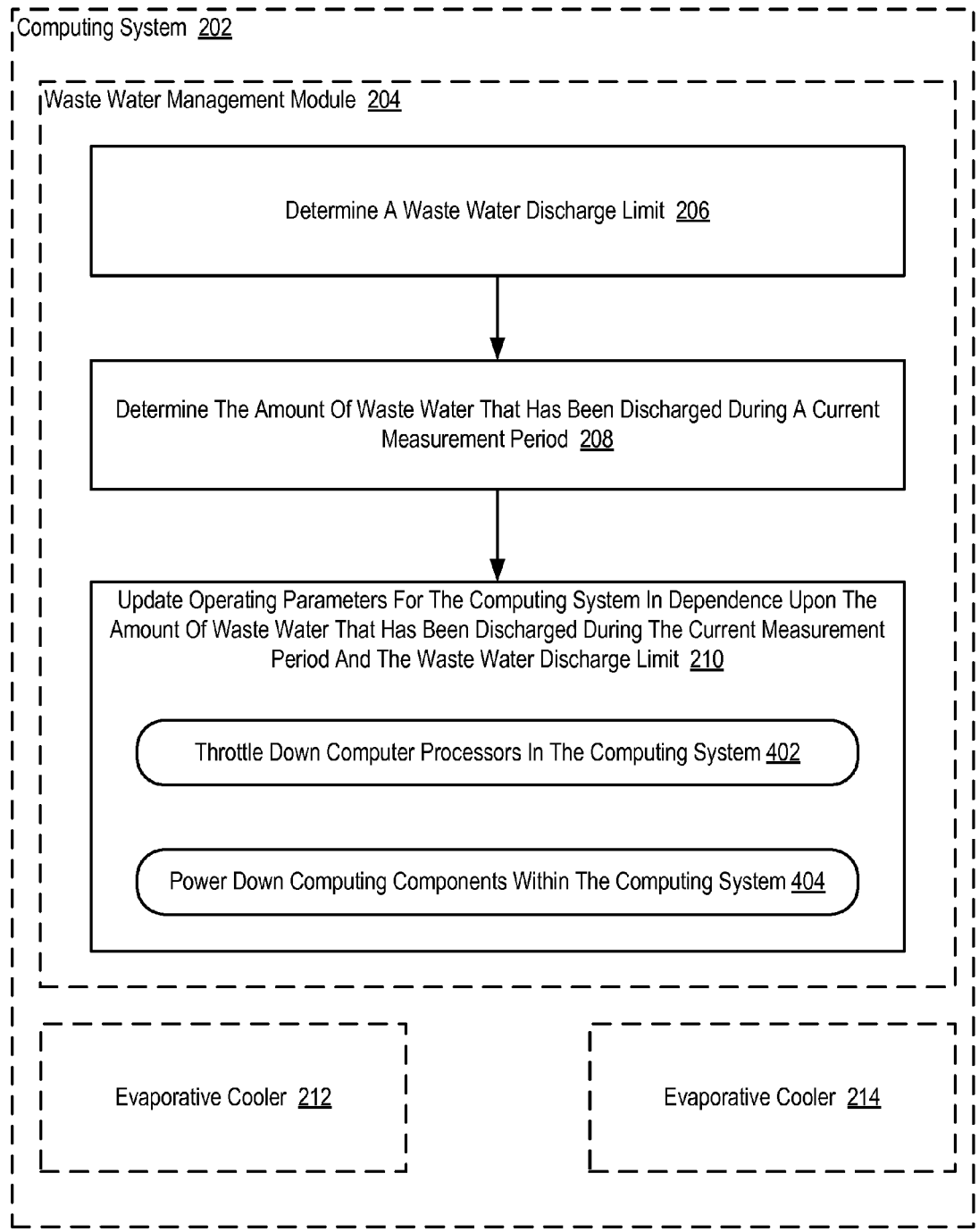
FIG. 4 sets forth a flow chart illustrating a further example method for managing waste water discharge of a computing system according to embodiments of the present invention.

For further explanation, FIG. 4 sets forth a further flow chart illustrating an example method for managing waste water discharge of a computing system (202) according to embodiments of the present invention. The example method of FIG. 3 is similar to the method of FIG. 2 as it also includes determining (206) a waste water discharge limit, determining (208) the amount of waste water that has been discharged during a current measurement period, and updating (210) operating parameters for the computing system (202) in dependence upon the amount of waste water that has been discharged during the current measurement period and the waste water discharge limit.

In the example method of FIG. 4, updating (210) operating parameters for the computing system (202) in dependence upon the amount of waste water that has been discharged during the current measurement period and the waste water discharge limit can include throttling (402) down computer processors in the computing system (202). In the example method of FIG. 4, throttling (402) down computer processors in the computing system (202) may be carried out by reducing the clock speed of the processor so that the processor executes fewer commands over a set period of time, thereby reducing the amount of heat generated by the processor.

In the example method of FIG. 4, updating (210) operating parameters for the computing system (202) in dependence upon the amount of waste water that has been discharged during the current measurement period and the waste water discharge limit can alternatively include powering (404)

down computing components within the computing system (202). In the example method of FIG. 4, powering (404) down computing components within the computing system (202) may be carried out, for example, by powering down components that are redundant, powering down components that are the largest generators of heat, and so on. Powering (404) down computing components within the computing system (202) can have the effect of reducing the amount of heat generated by the computing system (202), thereby reducing the amount of cooling that must be provided by the evaporative coolers (212, 214) and reducing the amount of waste water discharged from the evaporative coolers (212, 214).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for managing waste water discharge of a computing system, the computing system including one or more evaporative coolers, the apparatus comprising a computer processor, a computer memory operatively coupled to the computer processor, the computer memory having disposed within it computer program instructions that, when executed by the computer processor, cause the apparatus to carry out the steps of:
    determining, by a waste water management module, a waste water discharge limit, wherein the waste water discharge limit specifies the amount of waste water that can be discharged within a period of time;
    determining, by the waste water management module, the amount of waste water that has been discharged during a current measurement period; and
    updating, by the waste water management module, operating parameters for the computing system in dependence upon the amount of waste water that has been discharged during the current measurement period and the waste water discharge limit.

2. The apparatus of claim 1 wherein determining the waste water discharge limit further comprises receiving a regulatory specified waste water discharge limit.

3. The apparatus of claim 1 wherein determining the amount of waste water that has been discharged during the current measurement period further comprises monitoring a waste water discharge meter.

4. The apparatus of claim 1 wherein updating operating parameters for the computing system in dependence upon the amount of waste water that has been discharged during the current measurement period and the waste water discharge limit further comprises:
    determining the rate at which waste water is being discharged during the current measurement period;
    determining whether the rate at which waste water is being discharged during the current measurement period exceeds an allowable threshold; and
    responsive to determining that the rate at which waste water is being discharged during the current measurement period exceeds an allowable threshold, updating operating parameters for the computing system to bring the rate at which waste water is being discharged during the current measurement period below the allowable threshold.

5. The apparatus of claim 1 wherein updating operating parameters for the computing system includes throttling down computer processors in the computing system.

6. The apparatus of claim 1 wherein updating operating parameters for the computing system includes powering down computing components within the computing system.

7. A computer program product for managing waste water discharge of a computing system, the computing system including one or more evaporative coolers, the computer program product disposed upon a non-transitory, computer readable medium, the computer program product comprising computer program instructions that, when executed, cause a computer to carry out the steps of:
    determining, by a waste water management module, a waste water discharge limit, wherein the waste water discharge limit specifies the amount of waste water that can be discharged within a period of time;
    determining, by the waste water management module, the amount of waste water that has been discharged during a current measurement period; and
    updating, by the waste water management module, operating parameters for the computing system in dependence upon the amount of waste water that has been discharged during the current measurement period and the waste water discharge limit.

8. The computer program product of claim 7 wherein determining the waste water discharge limit further comprises receiving a regulatory specified waste water discharge limit.

9. The computer program product of claim 7 wherein determining the amount of waste water that has been discharged during the current measurement period further comprises monitoring a waste water discharge meter.

10. The computer program product of claim 7 wherein updating operating parameters for the computing system in dependence upon the amount of waste water that has been discharged during the current measurement period and the waste water discharge limit further comprises:
    determining the rate at which waste water is being discharged during the current measurement period;
    determining whether the rate at which waste water is being discharged during the current measurement period exceeds an allowable threshold; and
    responsive to determining that the rate at which waste water is being discharged during the current measurement period exceeds an allowable threshold, updating operating parameters for the computing system to bring the rate at which waste water is being discharged during the current measurement period below the allowable threshold.

11. The computer program product of claim 7 wherein updating operating parameters for the computing system includes throttling down computer processors in the computing system.

12. The computer program product of claim 7 wherein updating operating parameters for the computing system includes powering down computing components within the computing system.

13. The computer program product of claim 7 wherein the computer readable medium comprises a storage medium.

* * * * *